(12) United States Patent
Komiyama et al.

(10) Patent No.: US 8,815,149 B2
(45) Date of Patent: Aug. 26, 2014

(54) SEMI-REFLECTIVE FILM AND REFLECTIVE FILM FOR OPTICAL RECORDING MEDIUM, AND AG ALLOY SPUTTERING TARGET FOR FORMING SEMI-REFLECTIVE FILM OR REFLECTIVE FILM FOR OPTICAL RECORDING MEDIUM

(75) Inventors: Shozo Komiyama, Sanda (JP); Gou Yamaguchi, Sanda (JP); Akifumi Mishima, Saitama (JP)

(73) Assignee: Mitsubishi Materials Corporation, Tokyo (JP)

( * ) Notice: Subject to any disclaimer, the term of this patent is extended or adjusted under 35 U.S.C. 154(b) by 450 days.

(21) Appl. No.: 12/093,011

(22) PCT Filed: Dec. 28, 2006

(86) PCT No.: PCT/JP2006/326210
§ 371 (c)(1),
(2), (4) Date: May 8, 2008

(87) PCT Pub. No.: WO2007/074895
PCT Pub. Date: Jul. 5, 2007

(65) Prior Publication Data
US 2009/0169417 A1 Jul. 2, 2009

(30) Foreign Application Priority Data

Dec. 29, 2005 (JP) ................................. 2005-380534
May 19, 2006 (JP) ................................. 2006-139878
Sep. 8, 2006 (JP) ................................. 2006-243687

(51) Int. Cl.
*C22C 5/08* (2006.01)
*C22C 5/06* (2006.01)
*C23C 14/34* (2006.01)

(52) U.S. Cl.
USPC ........ 420/501; 428/64.4; 430/269; 204/298.13

(58) Field of Classification Search
USPC .................... 420/501, 502; 428/64.4; 430/269
See application file for complete search history.

(56) References Cited

U.S. PATENT DOCUMENTS

| 6,689,444 B2 | 2/2004 | Nakai et al. | |
|---|---|---|---|
| 7,507,458 B2 * | 3/2009 | Takagi et al. | ................. 428/64.1 |
| 2004/0028912 A1 | 2/2004 | Tauchi et al. | |

FOREIGN PATENT DOCUMENTS

| EP | 1 695 839 A1 | 8/2006 |
|---|---|---|
| JP | 2002-15464 A | 1/2002 |
| JP | 2002-319185 A | 10/2002 |
| JP | 2003-006926 A | 1/2003 |
| JP | 2003-306765 A | 10/2003 |
| JP | 2004-131747 A | 4/2004 |
| JP | 2005-100604 A | 4/2005 |
| JP | 2005-146419 A | 6/2005 |
| JP | 2005-178372 A | 7/2005 |
| JP | 2007-035104 A | 2/2007 |
| TW | 200306556 A | 11/2003 |
| TW | 200518084 A | 6/2005 |
| TW | 200521964 A | 7/2005 |
| WO | WO-2005/056848 A | 6/2005 |
| WO | WO-2005/056850 A | 6/2005 |

OTHER PUBLICATIONS

Machine translation of JP2004131747.*
Office Action mailed May 2, 2013 for the corresponding Taiwanese Application No. 095149234.
Chinese Office Action mailed Jun. 21, 2011 for the corresponding Chinese patent application No. 201010289035.3.
Search Report mailed Oct. 24, 2012 for the corresponding Taiwanese Patent Application No. 096107257.
Office Action mailed Mar. 30, 2010 for the corresponding Japanese Patent Application No. 2006-139878.
Office Action mailed Mar. 30, 2010 for the corresponding Japanese Patent Application No. 2006-243687.

* cited by examiner

*Primary Examiner* — Rebecca Lee
(74) *Attorney, Agent, or Firm* — Leason Ellis LLP.

(57) ABSTRACT

A semi-reflective film and reflective film for an optical recording medium, which is made of a silver alloy having a composition consisting of 0.001 to 0.1% by mass of Ca, 0.05 to 1% by mass of Mg, and a remainder containing Ag and inevitable impurities, and a target which is made of a silver alloy having a composition consisting of 0.001 to 0.1% by mass of Ca, 0.05 to 1% by mass of Mg, and a remainder containing Ag and inevitable impurities; and a semi-reflective film for an optical recording medium, which is made of a silver alloy having a composition consisting of 0.05 to 1% by mass of Mg, 0.05 to 1% by mass of one or more of Eu, Pr, Ce and Sm, and a remainder containing Ag and inevitable impurities, and an Ag alloy sputtering target for forming a semi-reflective film for an optical recording medium, which is made of a silver alloy having a composition consisting of 0.05 to 1% by mass of Mg, 0.05 to 1% by mass of one or more of Eu, Pr, Ce and Sm, and a remainder containing Ag and inevitable impurities.

8 Claims, No Drawings

SEMI-REFLECTIVE FILM AND REFLECTIVE FILM FOR OPTICAL RECORDING MEDIUM, AND AG ALLOY SPUTTERING TARGET FOR FORMING SEMI-REFLECTIVE FILM OR REFLECTIVE FILM FOR OPTICAL RECORDING MEDIUM

CROSS-REFERENCE TO PRIOR APPLICATION

This is a U.S. National Phase Application under 35 U.S.C. §371 of International Patent Application No. PCT/JP2006/326210 filed Dec. 28, 2006, and claims the benefit of Japanese Patent Application Nos. 2005-380534, filed Dec. 29, 2005, 2006-139878 filed May 19, 2006 and 2006-243687 filed Sep. 8, 2006, all of which are incorporated by reference herein. The International Application was published in Japanese on Jul. 5, 2007 as WO 2007/074895 A1 under PCT Article 21(2).

TECHNICAL FIELD

The present invention relates to a semi-reflective film or reflective film as a constituent layer of an optical recording medium such as an optical recording disc (CD-RW, DVD-RW, DVD-RAM, etc.) for recording or recording/replaying/erasing information signals such as sounds, images or characters utilizing a laser beam of a semiconductor laser or the like, and an Ag alloy sputtering target for forming the semi-reflective film or reflective film by a sputtering process. More particularly, the present invention relates to a semi-reflective film or reflective film of an optical recording disc for recording/replaying/erasing utilizing a blue laser beam (e.g., an optical recording disc of Blu-ray Disc standard or HD DVD standard), and a sputtering target for forming the semi-reflective film or reflective film.

BACKGROUND ART

In recent years, double layer optical recording medium having two layers of recording film have been proposed. A double layer optical recording medium is provided with an extremely thin semi-reflective film having a thickness of about 5 to 15 nm on the side of incident ray. This semi-reflective film not only functions as a reflective film for the recording layer on the side of incident ray, but also exhibits the function of transmitting laser beam to record or replay on the second recording layer. As the semi-reflective film for a double layer optical recording medium, a pure Ag film or an Ag alloy film has been used. A pure Ag film or an Ag alloy film is widely used because it not only allows heat to rapidly escape from the recording film, but also exhibits low absorptance to laser beams in a wide wavelength range of 400 to 800 nm.

As an example of a reflective film for an optical recording medium, a reflective film for an optical recording medium is known which has a composition consisting of 0.001 to 0.1% by mass of Ca and a remainder containing Ag, and this reflective film is formed by sputtering an Ag alloy target having a composition consisting of 0.001 to 0.1% by mass of Ca and a remainder containing Ag. This reflective film having a composition consisting of 0.001 to 0.1% by mass of Ca and a remainder containing Ag exhibits substantially the same reflectivity as a pure Ag reflective film, and is superior to a pure Ag film in that recrystallization is suppressed, and the reflectivity thereof does not decrease with lapse of time (see Patent Document 1).

Further, as another example of a reflective film for an optical recording medium, Patent Document 2 discloses a semi-reflective film which has a composition consisting of 0.1 atom % or more of at least one member selected from the group consisting of Nd and Y, 0.2 to 5.0 atom % of at least one member selected from the group consisting of Au, Cu, Pd, Mg, Ti and Ta, and a remainder containing Ag, and this semi-reflective film is formed by sputtering an Ag alloy target having a composition consisting of 0.1 atom % or more of at least one member selected from the group consisting of Nd and Y, 0.2 to 5.0 atom % of at least one member selected from the group consisting of Au, Cu, Pd, Mg, Ti and Ta, and a remainder containing Ag.

[Patent Document 1] Japanese Unexamined Patent Application, First Publication No. 2003-6926

[Patent Document 2] Japanese Unexamined Patent Application, First Publication No. 2002-15464

DISCLOSURE OF INVENTION

Problems to be Solved by the Invention

Generally, a semi-reflective film for an optical recording medium has a problem in that the efficiency of recording or replaying on the second recording layer is deteriorated by the absorption of incident ray. Therefore, in a semi-reflective film, it is required to reduce the absorption of incident ray by the semi-reflective film. On the other hand, in consideration of demand for high-speed recording on the first recording layer on the side of incident ray, a semi-reflective film is also required to exhibit a high thermal conductivity.

As a most suitable material for satisfying the above-mentioned properties, a pure Ag is known. However, although a semi-reflective film made of a pure Ag exhibits the lowest absorptance immediately after use, it has a problem in that, when the film is heated by recording or recording/replaying/erasing, the film agglomerates to generate holes in the semi-reflective film. Further, a semi-reflective film made of a pure Ag has a problem in that it exhibits a poor corrosion resistance, and hence, the absorptance thereof rapidly increases.

On the other hand, the present inventors produced a thin film having a thickness of 5 to 15 nm (which is about 1/10 of a reflective film) from a conventional Ag alloy target for a reflective film having a composition consisting of 0.001 to 0.1% by mass of Ca and a remainder containing Ag, and attempted to use this thin film as a semi-reflective film. As a result, it was found that this semi-reflective film produced from an Ag alloy having a composition consisting of 0.001 to 0.1% by mass of Ca and a remainder containing Ag was superior to a semi-reflective film produced from a pure Ag in that the film did not agglomerate when heated by recording or recording/replaying/erasing, and the film exhibited excellent corrosion resistance. However, although an effect of suppressing the change of absorptance with lapse of time was observed, this semi-reflective film was unsatisfactory in that it still exhibited a high absorption to incident ray.

Further, the present inventors used the semi-reflective film disclosed in Patent Document 2 which had a composition consisting of 0.1 atom % or more of at least one member selected from the group consisting of Nd and Y, 0.2 to 5.0 atom % of Mg and a remainder containing Ag. As a result, it was found that this semi-reflective film was also superior to a semi-reflective film made of a pure Ag in that the film did not agglomerate when heated by recording or recording/replaying/erasing, and the film exhibited excellent corrosion resistance. However, although an effect of suppressing the change of absorptance with lapse of time was observed, the effect was unsatisfactory, and further improvement has been demanded in suppression of the change in absorptance of incident ray with lapse of time.

Means to Solve the Problems

In this situation, the present inventors made studies to obtain an Ag alloy semi-reflective film exhibiting excellent properties with respect to agglomeration resistance and corrosion resistance, as well as small change in absorptance of incident ray with lapse of time.

As a result, it was found that (i) an Ag alloy film having a thickness of 5 to 15 nm obtained by sputtering an Ag alloy target having a composition consisting of 0.001 to 0.1% by mass of Ca, 0.05 to 1% by mass of Mg, and a remainder containing Ag exhibits a low absorptance, a high agglomeration resistance and a high corrosion resistance, and increase in the absorptance thereof is suppressed even after repeatedly recording or recording/replaying/erasing over a long period, and hence, the Ag alloy film exhibits excellent properties as a semi-transparent film for an optical recording medium;

(ii) an Ag alloy film having a thickness of 5 to 15 nm obtained by sputtering an Ag alloy target which is the Ag alloy target of item (i) above having a composition consisting of 0.001 to 0.1% by mass of Ca, 0.05 to 1% by mass of Mg, and a remainder containing Ag and inevitable impurities and further containing 0.1 to 2% by mass of Cu exhibits further improved agglomeration resistance and corrosion resistance while maintaining a low absorptance, and hence, the Ag alloy film exhibits excellent properties as a semi-transparent film for an optical recording medium;

(iii) an Ag alloy film having a thickness of 5 to 15 nm obtained by sputtering an Ag alloy target which is the Ag alloy target of item (i) above having a composition consisting of 0.001 to 0.1% by mass of Ca, 0.05 to 1% by mass of Mg, and a remainder containing Ag and inevitable impurities and further containing 0.05 to 1% by mass of a rare earth element exhibits further improved agglomeration resistance and corrosion resistance while maintaining a low absorptance, and hence, the Ag alloy film exhibits excellent properties as a semi-transparent film for an optical recording medium;

(iv) an Ag alloy film having a thickness of 5 to 15 nm obtained by sputtering an Ag alloy target which is the Ag alloy target of item (i) above having a composition consisting of 0.001 to 0.1% by mass of Ca, 0.05 to 1% by mass of Mg, and a remainder containing Ag and inevitable impurities and further containing 0.1 to 2% by mass of Cu and 0.05 to 1% by mass of a rare earth element exhibits further improved agglomeration resistance and corrosion resistance while maintaining a low absorptance, and hence, the Ag alloy film exhibits excellent properties as a semi-transparent film for an optical recording medium;

(v) a semi-reflective film made of a silver alloy having a composition consisting of 0.05 to 1% by mass of Mg, 0.05 to 1% by mass of one or more of Eu, Pr, Ce and Sm, and a remainder containing Ag and inevitable impurities is superior to a conventional Ag alloy semi-reflective film in that it exhibits further improved agglomeration resistance and corrosion resistance while maintaining a low absorptance, and hence, the film exhibits a smaller change in absorptance of incident ray with lapse of time; and (vi) the semi-reflective film of item (v) above can be obtained by sputtering an Ag alloy target made of an Ag alloy having a composition consisting of 0.05 to 1% by mass of Mg, 0.05 to 1% by mass of one or more of Eu, Pr, Ce and Sm, and a remainder containing Ag and inevitable impurities.

The present invention has been completed based on these findings.

Specifically, the present invention is related to (1) a semi-reflective film for an optical recording medium, which is made of a silver alloy having a composition consisting of 0.001 to 0.1% by mass of Ca, 0.05 to 1% by mass of Mg, and a remainder containing Ag and inevitable impurities;

(2) a semi-reflective film for an optical recording medium, which is made of a silver alloy having a composition consisting of 0.001 to 0.1% by mass of Ca, 0.05 to 1% by mass of Mg, 0.1 to 2% by mass of Cu and a remainder containing Ag and inevitable impurities;

(3) a semi-reflective film for an optical recording medium, which is made of a silver alloy having a composition consisting of 0.001 to 0.1% by mass of Ca, 0.05 to 1% by mass of Mg, 0.05 to 1% by mass of a rare earth element and a remainder containing Ag and inevitable impurities; and (4) a semi-reflective film for an optical recording medium, which is made of a silver alloy having a composition consisting of 0.001 to 0.1% by mass of Ca, 0.05 to 1% by mass of Mg, 0.1 to 2% by mass of Cu, 0.05 to 1% by mass of a rare earth element and a remainder containing Ag and inevitable impurities.

Further, the present inventors have found that Ag alloy films having a thickness of 50 to 150 nm obtained by sputtering Ag alloy targets having compositions described in items (i) to (iv) above exhibit an excellent thermal conductivity, a high agglomeration resistance and a high corrosion resistance, and hence, the Ag alloy film exhibits excellent properties as a reflective film for an optical recording medium.

Accordingly, the present invention is also related to (5) a reflective film for an optical recording medium, which is made of a silver alloy having a composition consisting of 0.001 to 0.1% by mass of Ca, 0.05 to 1% by mass of Mg, and a remainder containing Ag and inevitable impurities;

(6) a reflective film for an optical recording medium, which is made of a silver alloy having a composition consisting of 0.001 to 0.1% by mass of Ca, 0.05 to 1% by mass of Mg, 0.1 to 2% by mass of Cu and a remainder containing Ag and inevitable impurities;

(7) a reflective film for an optical recording medium, which is made of a silver alloy having a composition consisting of 0.001 to 0.1% by mass of Ca, 0.05 to 1% by mass of Mg, 0.05 to 1% by mass of a rare earth element and a remainder containing Ag and inevitable impurities; and (8) a reflective film for an optical recording medium, which is made of a silver alloy having a composition consisting of 0.001 to 0.1% by mass of Ca, 0.05 to 1% by mass of Mg, 0.1 to 2% by mass of Cu, 0.05 to 1% by mass of a rare earth element and a remainder containing Ag and inevitable impurities.

The semi-reflective films for an optical recording medium made of a silver alloy described in items (1) to (4) above and the reflective films for an optical recording medium made of a silver alloy described in items (5) to (8) can be produced from Ag alloy sputtering targets having the same compositions. Accordingly, the present invention is also related to (9) an Ag alloy sputtering target for forming a semi-reflective film or reflective film for an optical recording medium, which is made of a silver alloy having a composition consisting of 0.001 to 0.1% by mass of Ca, 0.05 to 1% by mass of Mg, and a remainder containing Ag and inevitable impurities;

(10) an Ag alloy sputtering target for forming a semi-reflective film or reflective film for an optical recording medium, which is made of a silver alloy having a composition consisting of 0.001 to 0.1% by mass of Ca, 0.05 to 1% by mass of Mg, 0.1 to 2% by mass of Cu and a remainder containing Ag and inevitable impurities;

(11) an Ag alloy sputtering target for forming a semi-reflective film or reflective film for an optical recording medium, which is made of a silver alloy having a composition consisting of 0.001 to 0.1% by mass of Ca, 0.05 to 1% by mass of Mg, 0.05 to 1% by mass of a rare earth element and a remainder containing Ag and inevitable impurities; and

(12) an Ag alloy sputtering target for forming a semi-reflective film or reflective film for an optical recording medium, which is made of a silver alloy having a composition consisting of 0.001 to 0.1% by mass of Ca, 0.05 to 1% by mass of Mg, 0.1 to 2% by mass of Cu, 0.05 to 1% by mass of a rare earth element and a remainder containing Ag and inevitable impurities.

Furthermore, the present invention is also related to

(13) a semi-reflective film for an optical recording medium, which is made of a silver alloy having a composition consisting of 0.05 to 1% by mass of Mg, 0.05 to 1% by mass of one or more of Eu, Pr, Ce and Sm, and a remainder containing Ag and inevitable impurities; and

(14) an Ag alloy sputtering target for forming a semi-reflective film for optical recording medium, which is made of a silver alloy having a composition consisting of 0.05 to 1% by mass of Mg, 0.05 to 1% by mass of one or more of Eu, Pr, Ce and Sm, and a remainder containing Ag and inevitable impurities.

Hereinbelow, the semi-reflective films of item (1) to (4) above for an optical recording medium, reflective films of item (5) to (8) above for an optical recording medium and the Ag alloy sputtering target of items (9) to (12) above will be described.

The Ag alloy sputtering targets of items (9) to (12) above for producing the semi-reflective films of item (1) to (4) above and the reflective films of item (5) to (8) above can be prepared as follows. As raw materials, a high-purity Ag having a purity of 99.99% by mass or more, a high-purity Mg having a purity of 99.9% by mass or more and a high-purity Ca having a purity of 99.9% by mass or more are prepared. Firstly, the high-purity Ag is melted under high vacuum conditions or in an insert gas atmosphere to obtain a molten high-purity Ag. Then, Ca is added to the molten high-purity Ag in a predetermined amount, and the resultant is cast under high vacuum conditions or in an inert gas atmosphere to obtain an Ag—Ca master alloy in advance.

Further, the high-purity Ag is melted under high vacuum conditions or in an insert gas atmosphere to obtain a molten high-purity Ag, and then, Mg is added to the molten high-purity Ag in a predetermined amount, and the resultant is cast under high vacuum conditions or in an inert gas atmosphere to obtain a Mg-containing molten Ag alloy. Then, the Ag—Ca master alloy prepared in advance is added to the Mg-containing molten Ag alloy, and the composition is adjusted so that the Ca content satisfies the predetermined composition. Subsequently, if necessary, Cu and/or a rare earth element are further added, and the resulting molten Ag alloy is cast into a mold to produce an ingot. Thereafter, the ingot is subjected to cold working, followed by mechanical working, thereby obtaining the Ag alloy sputtering targets of items (9) to (12) above. From the thus produced Ag alloy sputtering targets, the semi-reflective films of item (1) to (4) above and reflective films of item (5) to (8) above made of an Ag alloy according to the present invention can be produced by using a typical sputtering apparatus.

Next, the reasons for limiting the compositions of the semi-reflective films of items (1) to (4) above and reflective films of items (5) to (8) above which are made of an Ag alloy, and the Ag alloy sputtering targets of items (9) to (12) above for forming the semi-reflective films or the reflective films will be described.

Ca:

Ca hardly forms a solid solution with Ag. However, by formation of a film by sputtering, Ca is forced to form a solid solution within the crystal grains of Ag, and hence, self-diffusion of Ag within the crystal grains of the semi-reflective films and the reflective films is suppressed. Further, Ca is precipitated in the grain boundaries. As a result of the effects of being forced to form a solid solution within Ag and the effects of precipitating in the grain boundaries, crystal grains are prevented from agglomerating with each other even when the film is heated, thereby promoting the effect of preventing agglomeration of the semi-reflective films and the reflective films. For these reasons, Ca is added. However, when Ca is contained in an amount of less than 0.001% by mass, the desired effects cannot be achieved. On the other hand, when Ca is contained in an amount exceeding 0.1% by mass, a disadvantage is caused in that the thermal conductivity of the Ag alloy semi-reflective films and reflective films is lowered. Therefore, the amount of Ca contained in the Ag alloy semi-reflective films and reflective films and the Ag alloy sputtering target for forming the semi-reflective films and reflective films is set within the range of 0.001 to 0.1% by mass. A more preferable range is 0.01 to 0.05% by mass.

Mg:

Mg forms a solid solution with Ag, and functions to suppress the change of the semi-reflective films and the reflective films with lapse of time and to enhance the agglomeration resistance and corrosion resistance of the films. However, when Mg is contained in an amount of less than 0.05% by mass, the absorptance of the semi-reflective films increases within a short period, and hence, the effects of suppressing the change with lapse of time and enhancing the agglomeration resistance cannot be satisfactorily achieved. On the other hand, when Mg is contained in an amount exceeding 1% by mass, disadvantages are caused in that the absorptance of incident ray of the semi-transparent films increases and the reflectivity of the reflective films decreases, and hence, the efficiency of recording or replaying of the second recording layer of the optical recording disc is deteriorated. Therefore, the amount of Mg contained in the Ag alloy semi-reflective films and reflective films and the Ag alloy sputtering target for forming the semi-reflective films and reflective films is set within the range of 0.05 to 1% by mass. A more preferable range is 0.1 to 0.3% by mass.

Cu:

Cu forms a solid solution with Ag, and functions to enhance the agglomeration resistance and corrosion resistance of the semi-reflective films and the reflective films. For this reason, Cu is added if desired. However, when Cu is added in an amount of less than 0.1% by mass, the effect of enhancing the agglomeration resistance cannot be achieved. On the other hand, when Cu is added in an amount exceeding 2% by mass, the absorptance of the semi-reflective films increases, and the reflectivity of the reflective films decreases, thereby resulting in a disadvantage in that the efficiency of recording or replaying of the second recording layer of a double layer optical recording disc is deteriorated. Therefore, the amount of Cu added is set in the range of 0.1 to 2% by mass. A more preferable range is 0.2 to 0.6% by mass.

Rare Earth Element:

A rare earth element barely forms a solid solution with Ag, and also forms an intermetallic compound with Ag in the grain boundaries, thereby functioning to enhance the agglomeration resistance of the semi-reflective films and reflective films. For this reason, a rare earth element is added if desired. However, when a rare earth element is added in an amount of less than 0.05% by mass, the effect of enhancing the agglomeration resistance cannot be achieved. On the other hand, when a rare earth element is added in an amount exceeding 1% by mass, disadvantages are caused in that the corrosion resistance of the semi-reflective films and reflective films is adversely affected, and the thermal conductivity is lowered. Therefore, the amount of a rare earth element added is set within the range of 0.05 to 1% by mass. A more preferable range is 0.2 to 0.5% by mass. The rare earth element is more preferably one or more of Tb, Gd, Dy, Pr, Nd, Eu, La and Ce.

Next, the semi-transparent film of item (13) above and the Ag alloy sputtering target of item (14) above will be described.

The Ag alloy sputtering target of item (13) above for producing the semi-reflective film of item (14) above can be prepared as follows. As raw materials, a high-purity Ag having a purity of 99.99% by mass or more, a high-purity Mg having a purity of 99.9% by mass or more and high-purity Eu, Pr, Ce and Sm having a purity of 99.9% by mass or more are prepared. Firstly, the high-purity Ag is melted under high vacuum conditions or in an insert gas atmosphere to obtain a molten high-purity Ag, and then, Mg is added to the molten high-purity Ag in a predetermined amount to thereby obtain a Mg-containing molten Ag alloy. Then, one or more of Eu, Pr, Ce and Sm is added to the obtained Mg-containing molten Ag alloy, and the resulting molten Ag alloy is cast into a mold to produce an ingot. Thereafter, the ingot is subjected to cold working, followed by mechanical working, thereby obtaining the Ag alloy sputtering target of item (14) above. From the thus produced Ag alloy target, the semi-reflective film of item (13) above made of an Ag alloy according to the present invention can be produced by using a typical sputtering apparatus.

Next, the reasons for limiting the composition of the semi-reflective film of item (14) above which is made of an Ag alloy, and the Ag alloy sputtering target of item (13) above for producing forming the semi-reflective film will be described.

Mg:

Mg forms a solid solution with Ag, and functions to suppress the change of the semi-reflective film with lapse of time and to enhance the agglomeration resistance and corrosion resistance. However, when Mg is contained in an amount of less than 0.05% by mass, the absorptance of the semi-reflective film increases within a short period and the effect of enhancing the agglomeration resistance cannot be satisfactorily achieved. As a result, a disadvantage is caused in that the change in absporptance of incident ray with lapse of time cannot be satisfactorily suppressed. On the other hand, when Mg is contained in an amount exceeding 1% by mass, disadvantages are caused in that the absorptance of incident ray of the semi-transparent film increases, and hence, the efficiency of recording or replaying of the second recording layer of the optical recording disc is deteriorated. Therefore, the amount of Mg contained in the Ag alloy semi-reflective film and the Ag alloy sputtering target for forming the semi-reflective film is set within the range of 0.05 to 1% by mass. A more preferable range is 0.1 to 0.3% by mass.

Eu, Pr, Ce and Sm:

These rare earth elements barely form solid solutions with Ag, and also form intermetallic compounds with Ag in the grain boundaries, thereby functioning to enhance the agglomeration resistance of the semi-reflective film. For this reason, a rare earth element is added. However, when these rare earth elements are added in an amount of less than 0.05% by mass, the effect of enhancing the agglomeration resistance cannot be achieved. On the other hand, when the rare earth elements are added in an amount exceeding 1% by mass, disadvantages are caused in that the corrosion resistance of the semi-reflective film and reflective film is adversely affected, and the thermal conductivity is lowered. Therefore, the amount of the rare earth elements added is set within the range of 0.05 to 1% by mass. A more preferable range is 0.2 to 0.5% by mass.

Effect of the Invention

The semi-reflective film and reflective film for an optical recording medium according to the present invention produced from an Ag alloy sputtering target exhibit substantially the same corrosion resistance as conventional semi-reflective film and reflective film for an optical recording medium produced from an Ag alloy sputtering target. Further, the semi-reflective film and reflective film according to the present invention are superior to conventional semi-reflective film and reflective film in that they exhibit a high thermal conductivity and a low absorptance which are close to those of a semi-reflective film and reflective film made of a pure Ag, and the increase in absorption of the film by the change of the semi-reflective film with lapse of time and the decrease in the reflectivity of the reflective film can be suppressed. As a result, an optical recording medium usable over a long period can be produced. Therefore, the present invention greatly contributes to development in media industry.

BEST MODE FOR CARRYING OUT THE INVENTION

As raw materials, Ag having a purity of 99.99% by mass or more, Ca having a purity of 99.9% by mass or more, Mg having a purity of 99.9% by mass or more, Cu having a purity of 99.999% by mass or more and Tb, Gd, Dy, Pr, Nd, Eu, La and Ce having a purity of 99% by mass or more were prepared.

Firstly, Ag was melted in a high-frequency vacuum melting furnace to obtain a molten Ag. Then, Ca was added to the molten Ag so that the content thereof became 6% by mass, and an Ar gas was introduced into the furnace to increase the pressure inside the furnace to atmospheric pressure. Thereafter, the resulting molten metal was cast into a graphite mold, thereby obtaining an Ag-6% by mass Ca master alloy.

Subsequently, Ag was melted in a high-frequency vacuum melting furnace to obtain a molten Ag. Then, Mg was added to the molten Ag, the Ag-6% by mass Ca master alloy was further added and melted, and Cu, Th, Gd, Dy, Pr, Nd, Eu, La and Ce were optionally added and melted, and the resulting molten Ag alloy was cast into a mold to obtain an ingot. The obtained ingot was subjected to cold working, followed by heating at 600° C. under atmospheric pressure for 2 hours and subjecting to mechanical working, thereby obtaining present invention targets 1A to 46A and comparative targets 1A to 12A which had a size of 152.4 mm in diameter and 6 mm in thickness, and respective compositions indicated in Tables 1 and 2.

Further, for comparison, conventional target 1A was produced as follows. Ag was melted in a high-frequency vacuum melting furnace to obtain a molten Ag. The obtained molten Ag was cast into a graphite mold in an Ar gas atmosphere to obtain an ingot. Then, the obtained ingot was cut into a predetermined size, and subjected to cold rolling. Thereafter, the resultant was heated at 550° C. for 1 hour, followed by mechanical working, thereby obtaining conventional target 1A consisting of a pure Ag as shown in Table 2, which had a size of 152.4 mm in diameter and 6 mm in thickness.

Furthermore, for comparison, conventional target 2A was produced as follows. Ag was melted in a high-frequency vacuum melting furnace to obtain a molten Ag. Then, the above-mentioned Ag-6% by mass Ca master alloy was added to the molten Ag to obtain a molten Ag alloy. The obtained molten Ag alloy was cast into a graphite mold in an Ar gas atmosphere to obtain an ingot. Then, the obtained ingot was cut into a predetermined size, and subjected to cold rolling. Thereafter, the resultant was heated at 550° C. for 1 hour, followed by mechanical working, thereby obtaining conventional target 2A consisting of an Ag alloy as shown in Table 2, which had a size of 152.4 mm in diameter and 6 mm in thickness.

Example 1A

Present invention targets 1A to 46A, comparative targets 1A to 12A and conventional targets 1A and 2A prepared in advance were respectively soldered to backing plates made of oxygen-free copper. Each backing plate was mounted on a direct-current magnetron sputtering apparatus. Then, using a vacuum exhauster, the pressure inside the direct-current magnetron sputtering apparatus was reduced to $1 \times 10^{-4}$ Pa. Then, an Ar gas was introduced into the sputtering apparatus and a gas pressure of 1.0 Pa as a sputtering condition was obtained. Thereafter, from a direct current power source, direct-current power of 250 W was applied to the target to generate plasma between the target and a Si wafer substrate provided with an oxide film and having a size of 30 mm in length, 30 mm in width and 1 mm in thickness or a polycarbonate substrate having a size of 30 mm in length, 30 mm in width and 0.6 mm in thickness, which was placed opposite to the target in parallel arrangement with an intervening spacing of 70 mm. In this manner, present invention reflective films 1A to 46A, comparative reflective films 1A to 12A and conventional reflective films 1A and 2A each having a thickness of 100 nm were formed from Ag alloys having the compositions shown in Tables 3 to 7.

With respect to the thus obtained present invention reflective films 1A to 46A, comparative reflective films 1A to 12A and conventional reflective films 1A and 2A each having a thickness of 100 nm, the following tests were performed.

(a) Measurement of Thermal Conductivity of Reflective Film

With respect to present invention reflective films 1A to 46A, comparative reflective films 1A to 12A and conventional reflective films 1A and 2A each having a thickness of 100 nm and the respective compositions shown in Tables 3 to 7 and respectively formed on Si wafer substrates provided with an oxide film, the specific resistance was measured by a four-point probe method. From the specific resistance, the thermal conductivity was determined by the formula of Wiedemann-Franz law: $\kappa = 2.44 \times 10^{-8} \, T/\rho$ (wherein $\kappa$ represents thermal conductivity, T represents absolute temperature, and $\rho$ represents specific resistance). The results are shown in Tables 3 to 7.

(b) Test for Evaluating Corrosion Resistance of Reflective Film

With respect to a reflective film formed on a polycarbonate substrate, reflectivity was measured immediately after formation of the film using a spectrophotometer. The results are shown in Tables 3 to 7. Subsequently, the reflective film made of an Ag alloy was placed within a thermo-hygrostat at a temperature of 80° C. and a relative humidity of 85% for 200 hours. Thereafter, reflectivity of the film was measured under the same conditions. From the thus obtained data of the reflectivity, the reflectivity for wavelengths of 405 nm and 650 nm were respectively determined. The results are shown in Tables 3 to 7. The corrosion resistance of the reflective film for an optical recording medium was evaluated based on these results.

(c) Test for Evaluating Coarsening of Crystal Grains of Reflective Film

With respect to a reflective film formed on a Si wafer substrate provided with an oxide film, the average surface roughness was measured by a scanning probe microscope immediately after the formation of the film. The results are shown in Tables 3 to 7. Subsequently, the formed reflective film was maintained in vacuum at 250° C. for 30 minutes. Thereafter, the average surface roughness was measured under the same conditions. The results are shown in Tables 3 to 7. The tendency of coarsening of the crystal grains was evaluated based on these results.

As the scanning probe microscope, SPA-400AFM manufactured by Seiko Instruments Inc. was used, and the average surface roughness (Ra) was measured with respect to a region of 1 μm×1 μm. The average surface roughness was defined as the center line surface roughness prescribed in JIS B0601 which has been extended to three-dimension so as to be applied to surfaces, and was determined by the following formula:

$$Ra = 1/S_0 \iint |F(X,Y) - Z_0| dX dY$$

wherein F(X,Y) represents the surface shown by all measured data; $S_0$ represents the area of the designated surface on the assumption that the designated surface is ideally flat; and $Z_0$ represents the average value of Z data within the designated surface.

TABLE 1

| | | Composition (% by mass) | | | | |
|---|---|---|---|---|---|---|
| Target | | Ca | Mg | Cu | Rare earth element | Ag and inevitable impurities |
| Present Invention | 1A | 0.09 | 0.05 | — | — | Remainder |
| | 2A | 0.07 | 0.1 | — | — | Remainder |
| | 3A | 0.07 | 0.2 | — | — | Remainder |
| | 4A | 0.05 | 0.3 | — | — | Remainder |
| | 5A | 0.03 | 0.5 | — | — | Remainder |
| | 6A | 0.01 | 0.7 | — | — | Remainder |
| | 7A | 0.005 | 0.9 | — | — | Remainder |
| | 8A | 0.005 | 0.3 | — | — | Remainder |
| | 9A | 0.01 | 0.3 | — | — | Remainder |
| | 10A | 0.05 | 0.2 | — | — | Remainder |
| | 11A | 0.09 | 0.2 | — | — | Remainder |
| | 12A | 0.05 | 0.2 | 0.1 | — | Remainder |
| | 13A | 0.05 | 0.3 | 0.2 | — | Remainder |
| | 14A | 0.03 | 0.2 | 0.4 | — | Remainder |
| | 15A | 0.01 | 0.3 | 0.6 | — | Remainder |
| | 16A | 0.01 | 0.2 | 1.0 | — | Remainder |
| | 17A | 0.01 | 0.1 | 1.4 | — | Remainder |
| | 18A | 0.01 | 0.1 | 1.8 | — | Remainder |
| | 19A | 0.03 | 0.2 | — | Tb: 0.9 | Remainder |
| | 20A | 0.03 | 0.3 | — | Tb: 0.3 | Remainder |
| | 21A | 0.03 | 0.1 | — | Gd: 0.3 | Remainder |
| | 22A | 0.03 | 0.2 | — | Gd: 0.6 | Remainder |
| | 23A | 0.03 | 0.3 | — | Dy: 0.1 | Remainder |
| | 24A | 0.03 | 0.1 | — | Dy: 0.4 | Remainder |
| | 25A | 0.03 | 0.2 | — | Pr: 0.2 | Remainder |
| | 26A | 0.03 | 0.3 | — | Pr: 0.7 | Remainder |
| | 27A | 0.03 | 0.1 | — | Nd: 0.8 | Remainder |
| | 28A | 0.03 | 0.2 | — | Nd: 0.3 | Remainder |
| | 29A | 0.03 | 0.3 | — | Eu: 0.2 | Remainder |
| | 30A | 0.03 | 0.1 | — | Eu: 0.9 | Remainder |

TABLE 2

| Target | | Composition (% by mass) | | | | Ag and inevitable impurities |
|---|---|---|---|---|---|---|
| | | Ca | Mg | Cu | Rare earth element | |
| Present Invention | 31A | 0.03 | 0.2 | — | La: 0.3 | Remainder |
| | 32A | 0.03 | 0.3 | — | La: 0.7 | Remainder |
| | 33A | 0.03 | 0.1 | — | Ce: 0.4 | Remainder |
| | 34A | 0.03 | 0.2 | — | Ce: 0.6 | Remainder |
| | 35A | 0.03 | 0.3 | 0.2 | Tb: 0.4 | Remainder |
| | 36A | 0.03 | 0.1 | 0.2 | Gd: 0.5 | Remainder |
| | 37A | 0.03 | 0.2 | 0.4 | Pr: 0.3 | Remainder |
| | 38A | 0.03 | 0.3 | 0.4 | Nd: 0.4 | Remainder |
| | 39A | 0.03 | 0.2 | 0.6 | Eu: 0.5 | Remainder |
| | 40A | 0.03 | 0.2 | 0.6 | Ce: 0.2 | Remainder |
| | 41A | 0.03 | 0.3 | — | Tb: 0.2, Eu: 0.1 | Remainder |
| | 42A | 0.03 | 0.3 | — | Dy: 0.2, La: 0.2 | Remainder |
| | 43A | 0.03 | 0.2 | — | Gd: 0.2, Pr: 0.1, Ce: 0.1 | Remainder |
| | 44A | 0.03 | 0.2 | 0.2 | Tb: 0.2, Eu: 0.1 | Remainder |
| | 45A | 0.03 | 0.2 | 0.3 | Dy: 0.2, La: 0.1 | Remainder |
| | 46A | 0.03 | 0.2 | 0.2 | Gd: 0.1, Pr: 0.1, Ce: 0.1 | Remainder |
| Comparative | 1A | 0.03 | 0.04* | — | — | Remainder |
| | 2A | 0.03 | 1.1* | — | — | Remainder |
| | 3A | 0.6* | 0.3 | — | — | Remainder |
| | 4A | 0.03 | 0.3 | 3.0* | — | Remainder |
| | 5A | 0.03 | 0.3 | — | Tb: 1.2* | Remainder |
| | 6A | 0.03 | 0.3 | — | Gd: 1.3* | Remainder |
| | 7A | 0.03 | 0.3 | — | Dy: 1.1* | Remainder |
| | 8A | 0.03 | 0.2 | — | Pr: 2.0* | Remainder |
| | 9A | 0.03 | 0.2 | — | Nd: 1.5* | Remainder |
| | 10A | 0.03 | 0.2 | — | Eu: 2.5* | Remainder |
| | 11A | 0.03 | 0.2 | — | La: 1.3* | Remainder |
| | 12A | 0.03 | 0.2 | — | Ce: 1.1* | Remainder |
| Conventional | 1A | — | — | — | — | Remainder |
| | 2A | 0.03 | — | — | — | Remainder |

Note:
*indicates a value outside the scope of the present invention

TABLE 3

| Reflective film | | Composition of reflective film (% by mass) | Thermal conductivity (W/m·k) | Average surface roughness of film (nm) | | Reflectivity at wavelength of 405 nm (%) | | Reflectivity at wavelength of 650 nm (%) | |
|---|---|---|---|---|---|---|---|---|---|
| | | | | Immediately after formation of film | After maintaining at 250° C. for 30 minutes | Immediately after formation of film | After 200 hours | Immediately after formation of film | After 200 hours |
| Present invention | 1A | Same as present invention target 1A | 250 | 1.1 | 1.3 | 93 | 91 | 98 | 97 |
| | 2A | Same as present invention target 2A | 240 | 1.0 | 1.2 | 92 | 90 | 98 | 98 |
| | 3A | Same as present invention target 3A | 235 | 0.9 | 1.0 | 92 | 89 | 98 | 97 |
| | 4A | Same as present invention target 4A | 220 | 0.8 | 0.9 | 91 | 89 | 98 | 97 |
| | 5A | Same as present invention target 5A | 215 | 0.8 | 0.9 | 90 | 88 | 98 | 97 |
| | 6A | Same as present invention target 6A | 200 | 0.9 | 1.0 | 89 | 87 | 97 | 97 |
| | 7A | Same as present invention target 7A | 190 | 0.9 | 0.9 | 88 | 86 | 97 | 97 |
| | 8A | Same as present invention target 8A | 235 | 0.9 | 1.0 | 92 | 90 | 98 | 97 |
| | 9A | Same as present invention target 9A | 230 | 0.8 | 0.9 | 93 | 91 | 98 | 98 |
| | 10A | Same as present invention target 10A | 240 | 0.8 | 0.8 | 92 | 90 | 98 | 97 |
| | 11A | Same as present invention target 11A | 230 | 0.8 | 0.9 | 92 | 89 | 98 | 97 |
| | 12A | Same as present invention target 12A | 230 | 0.8 | 0.8 | 91 | 88 | 98 | 98 |

TABLE 3-continued

|  |  | Composition of reflective film (% by mass) | Thermal conductivity (W/m · k) | Average surface roughness of film (nm) | | Reflectivity at wavelength of 405 nm (%) | | Reflectivity at wavelength of 650 nm (%) | |
|---|---|---|---|---|---|---|---|---|---|
|  |  |  |  | Immediately after formation of film | After maintaining at 250° C. for 30 minutes | Immediately after formation of film | After 200 hours | Immediately after formation of film | After 200 hours |
|  | 13A | Same as present invention target 13A | 225 | 0.8 | 0.8 | 90 | 88 | 98 | 97 |
|  | 14A | Same as present invention target 14A | 210 | 0.7 | 0.8 | 90 | 87 | 97 | 96 |

TABLE 4

|  |  | Composition of reflective film (% by mass) | Thermal conductivity (W/m · k) | Average surface roughness of film (nm) | | Reflectivity at wavelength of 405 nm (%) | | Reflectivity at wavelength of 650 nm (%) | |
|---|---|---|---|---|---|---|---|---|---|
| Reflective film |  |  |  | Immediately after formation of film | After maintaining at 250° C. for 30 minutes | Immediately after formation of film | After 200 hours | Immediately after formation of film | After 200 hours |
| Present invention | 15A | Same as present invention target 15A | 205 | 0.8 | 0.8 | 90 | 88 | 97 | 97 |
|  | 16A | Same as present invention target 16A | 190 | 0.7 | 0.8 | 89 | 87 | 97 | 96 |
|  | 17A | Same as present invention target 17A | 180 | 0.7 | 0.7 | 89 | 86 | 96 | 96 |
|  | 18A | Same as present invention target 18A | 170 | 0.6 | 0.7 | 88 | 85 | 96 | 95 |
|  | 19A | Same as present invention target 19A | 180 | 0.6 | 0.6 | 89 | 86 | 97 | 96 |
|  | 20A | Same as present invention target 20A | 195 | 0.7 | 0.7 | 92 | 90 | 97 | 97 |
|  | 21A | Same as present invention target 21A | 210 | 0.7 | 0.8 | 91 | 89 | 97 | 96 |
|  | 22A | Same as present invention target 22A | 185 | 0.6 | 0.7 | 90 | 87 | 96 | 95 |
|  | 23A | Same as present invention target 23A | 215 | 0.8 | 0.8 | 92 | 90 | 97 | 96 |
|  | 24A | Same as present invention target 24A | 195 | 0.7 | 0.7 | 90 | 87 | 96 | 95 |
|  | 25A | Same as present invention target 25A | 210 | 0.7 | 0.7 | 90 | 88 | 97 | 96 |
|  | 26A | Same as present invention target 26A | 180 | 0.6 | 0.6 | 89 | 87 | 96 | 95 |
|  | 27A | Same as present invention target 27A | 175 | 0.6 | 0.7 | 89 | 86 | 96 | 95 |
|  | 28A | Same as present invention target 28A | 200 | 0.7 | 0.8 | 91 | 89 | 96 | 96 |

TABLE 5

|  |  | Composition of reflective film (% by mass) | Thermal conductivity (W/m · k) | Average surface roughness of film (nm) | | Reflectivity at wavelength of 405 nm (%) | | Reflectivity at wavelength of 650 nm (%) | |
|---|---|---|---|---|---|---|---|---|---|
| Reflective film |  |  |  | Immediately after formation of film | After maintaining at 250° C. for 30 minutes | Immediately after formation of film | After 200 hours | Immediately after formation of film | After 200 hours |
| Present invention | 29A | Same as present invention target 29A | 210 | 0.7 | 0.7 | 92 | 90 | 97 | 97 |
|  | 30A | Same as present invention target 30A | 170 | 0.6 | 0.7 | 89 | 86 | 96 | 95 |
|  | 31A | Same as present invention target 31A | 205 | 0.7 | 0.7 | 91 | 89 | 97 | 96 |
|  | 32A | Same as present invention target 32A | 180 | 0.6 | 0.7 | 90 | 87 | 96 | 95 |
|  | 33A | Same as present invention target 33A | 205 | 0.7 | 0.8 | 91 | 89 | 97 | 96 |

TABLE 5-continued

| Reflective film | | Composition of reflective film (% by mass) | Thermal conductivity (W/m · k) | Average surface roughness of film (nm) | | Reflectivity at wavelength of 405 nm (%) | | Reflectivity at wavelength of 650 nm (%) | |
|---|---|---|---|---|---|---|---|---|---|
| | | | | Immediately after formation of film | After maintaining at 250° C. for 30 minutes | Immediately after formation of film | After 200 hours | Immediately after formation of film | After 200 hours |
| | 34A | Same as present invention target 34A | 190 | 0.6 | 0.7 | 90 | 88 | 96 | 96 |
| | 35A | Same as present invention target 35A | 190 | 0.6 | 0.6 | 91 | 89 | 97 | 96 |
| | 36A | Same as present invention target 36A | 190 | 0.6 | 0.7 | 90 | 87 | 96 | 96 |
| | 37A | Same as present invention target 37A | 185 | 0.6 | 0.6 | 89 | 87 | 96 | 96 |
| | 38A | Same as present invention target 38A | 180 | 0.6 | 0.6 | 89 | 86 | 97 | 96 |
| | 39A | Same as present invention target 39A | 170 | 0.6 | 0.6 | 88 | 85 | 96 | 95 |
| | 40A | Same as present invention target 40A | 175 | 0.6 | 0.7 | 88 | 86 | 96 | 95 |
| | 41A | Same as present invention target 41A | 190 | 0.7 | 0.8 | 92 | 90 | 97 | 97 |
| | 42A | Same as present invention target 42A | 185 | 0.7 | 0.7 | 91 | 89 | 97 | 96 |

TABLE 6

| Reflective film | | Composition of reflective film (% by mass) | Thermal conductivity (W/m · k) | Average surface roughness of film (nm) | | Reflectivity at wavelength of 405 nm (%) | | Reflectivity at wavelength of 650 nm (%) | |
|---|---|---|---|---|---|---|---|---|---|
| | | | | Immediately after formation of film | After maintaining at 250° C. for 30 minutes | Immediately after formation of film | After 200 hours | Immediately after formation of film | After 200 hours |
| Present invention | 43A | Same as present invention target 43A | 190 | 0.7 | 0.7 | 91 | 89 | 97 | 96 |
| | 44A | Same as present invention target 44A | 185 | 0.6 | 0.7 | 90 | 88 | 97 | 96 |
| | 45A | Same as present invention target 45A | 180 | 0.6 | 0.6 | 89 | 87 | 96 | 95 |
| | 46A | Same as present invention target 46A | 185 | 0.6 | 0.7 | 91 | 88 | 97 | 96 |
| Comparative | 1A | Same as comparative target 1A | 255 | 1.0 | 3.2 | 93 | 86 | 98 | 94 |
| | 2A | Same as comparative target 2A | 175 | 0.9 | 0.9 | 83 | 80 | 92 | 90 |
| | 3A | Same as comparative target 3A | 170 | 0.9 | 1.0 | 85 | 82 | 94 | 92 |
| | 4A | Same as comparative target 4A | 120 | 0.6 | 0.6 | 80 | 70 | 92 | 88 |
| | 5A | Same as comparative target 5A | 125 | 0.6 | 0.7 | 83 | 79 | 92 | 89 |
| | 6A | Same as comparative target 6A | 115 | 0.6 | 0.6 | 82 | 79 | 92 | 88 |
| | 7A | Same as comparative target 7A | 120 | 0.7 | 0.7 | 85 | 81 | 94 | 90 |
| | 8A | Same as comparative target 8A | 100 | 0.6 | 0.6 | 81 | 78 | 91 | 88 |

TABLE 6-continued

| Reflective film | | Composition of reflective film (% by mass) | Thermal conductivity (W/m · k) | Average surface roughness of film (nm) | | Reflectivity at wavelength of 405 nm (%) | | Reflectivity at wavelength of 650 nm (%) | |
|---|---|---|---|---|---|---|---|---|---|
| | | | | Immediately after formation of film | After maintaining at 250° C. for 30 minutes | Immediately after formation of film | After 200 hours | Immediately after formation of film | After 200 hours |
| | 9A | Same as comparative target 9A | 110 | 0.6 | 0.7 | 83 | 80 | 93 | 89 |
| | 10A | Same as comparative target 10A | 95 | 0.6 | 0.6 | 80 | 76 | 90 | 87 |

TABLE 7

| Reflective film | | Composition of reflective film (% by mass) | Thermal conductivity (W/m · k) | Average surface roughness of film (nm) | | Reflectivity at wavelength of 405 nm (%) | | Reflectivity at wavelength of 650 nm (%) | |
|---|---|---|---|---|---|---|---|---|---|
| | | | | Immediately after formation of film | After maintaining at 250° C. for 30 minutes | Immediately after formation of film | After 200 hours | Immediately after formation of film | After 200 hours |
| Comparative | 11A | Same as comparative target 11A | 115 | 0.6 | 0.6 | 84 | 80 | 92 | 88 |
| | 12A | Same as comparative target 12A | 125 | 0.6 | 0.7 | 85 | 81 | 93 | 90 |
| Conventional | 1A | Same as conventional target 1A | 312 | 1.8 | 5.9 | 94 | 72 | 98 | 89 |
| | 2A | Same as conventional target 2A | 165 | 1.1 | 4.7 | 93 | 81 | 98 | 92 |

As seen from the results shown in Tables 1 to 7, present invention reflective films 1A to 46A obtained by sputtering present invention targets 1A to 46A exhibited substantially the same thermal conductivity as the conventional reflective films 1A and 2A obtained by sputtering conventional targets 1A and 2A, and were superior to conventional reflective films 1A and 2A in that the reflectivity was not lowered after maintaining in a thermo-hygrostat at a temperature of 80° C. and a relative humidity of 85% for 200 hours, and coarsening of crystal grains did not easily occur. On the other hand, comparative reflective films 1A to 12A obtained by sputtering comparative targets 1A to 12A each having a composition outside the scope of the present invention were disadvantageous in that the reflectivity was lowered, the thermal conductivity was lowered and coarsening of crystal grains occurred.

Example 2A

Present invention targets 1A to 46A, comparative targets 1A to 12A and conventional targets 1A and 2A prepared in advance were respectively soldered to backing plates made of oxygen-free copper. Each backing plate was mounted on a direct-current magnetron sputtering apparatus. Then, using a vacuum exhauster, the pressure inside the direct-current magnetron sputtering apparatus was reduced to $1 \times 10^{-4}$ Pa. Then, an Ar gas was introduced into the sputtering apparatus and a gas pressure of 1.0 Pa as a sputtering condition was obtained. Thereafter, from a direct current power source, direct-current power of 100 W was applied to the target to generate plasma between the target and a polycarbonate substrate having a size of 30 mm in length, 30 mm in width and 0.6 mm in thickness, which was placed opposite to the target in parallel arrangement with an intervening spacing of 70 mm. In this manner, present invention semi-reflective films 1A to 46A, comparative semi-reflective films 1A to 12A and conventional semi-reflective films 1A and 2A having a thickness of 10 nm and the respective compositions shown in Tables 8 to 10 were respectively formed on polycarbonate substrates. With respect to the thus obtained present invention semi-reflective films 1A to 46A, comparative semi-reflective films 1A to 12A and conventional semi-reflective films 1A and 2A, the following tests were performed. The results are shown in Tables 8 to 10.

(d) Measurement of Thermal Conductivity of Semi-reflective Film

Since the thermal conductivity of the semi-reflective films is the same as the thermal conductivity of the reflective films obtained in Example 1A, the thermal conductivity of the reflective films measured in Example 1A is indicated in Tables 8 to 10 as the thermal conductivity of the semi-reflective films.

(e) Measurement of Absorptance of Semi-reflective Film

With respect to present invention semi-reflective films 1A to 46A, comparative semi-reflective films 1A to 12A and conventional semi-reflective films 1A and 2A having a thickness of 10 nm and the respective compositions shown in Tables 8 to 10 and respectively formed on polycarbonate substrates, the reflectivity and transmittance at a wavelength of 650 nm were measured on the semi-reflective film side using a spectrophotometer. The absorptance was determined by the formula: 100−(reflectivity+transmittance). The results are shown in Tables 8 to 10.

(f) Measurement of Agglomeration Resistance of Semi-reflective Film

Present invention semi-reflective films 1A to 46A, comparative semi-reflective films 1A to 12A and conventional semi-reflective films 1A and 2A having a thickness of 10 nm and the respective compositions shown in Tables 8 to 10 and respectively formed on polycarbonate substrates were used as samples for evaluating the agglomeration resistance. The samples were placed within a thermo-hygrostat at a temperature of 80° C. and a relative humidity of 85% for 300 hours. Then, with respect to the samples, the reflectivity and transmittance at a wavelength of 650 nm were measured on the semi-reflective film side using a spectrophotometer, and the absorptance of the film after the agglomeration resistance test was determined in the same manner as described above. Using the absorptance values measured in item (e) above as the aborptance prior to the agglomeration resistance test, the increase in the absorptance following the agglomeration resistance test was determined to evaluate the agglomeration resistance of the semi-reflective films. The results are shown in Tables 8 to 10.

TABLE 8

| Semi-reflective film | | Composition of semi-reflective film (% by mass) | Thermal conductivity (W/m · k) | Absorptance at wavelength of 650 nm (%) | Increase in absorptance (%) |
|---|---|---|---|---|---|
| Present invention | 1A | Same as present invention target 1A | 250 | 1.2 | 2.9 |
| | 2A | Same as present invention target 2A | 240 | 1.5 | 2.7 |
| | 3A | Same as present invention target 3A | 235 | 1.6 | 2.6 |
| | 4A | Same as present invention target 4A | 220 | 1.7 | 2.0 |
| | 5A | Same as present invention target 5A | 215 | 1.8 | 2.1 |
| | 6A | Same as present invention target 6A | 200 | 1.9 | 2.3 |
| | 7A | Same as present invention target 7A | 190 | 2.1 | 2.0 |
| | 8A | Same as present invention target 8A | 235 | 1.5 | 2.1 |
| | 9A | Same as present invention target 9A | 230 | 1.6 | 2.0 |
| | 10A | Same as present invention target 10A | 240 | 1.6 | 2.3 |
| | 11A | Same as present invention target 11A | 230 | 1.5 | 2.2 |
| | 12A | Same as present invention target 12A | 230 | 1.5 | 1.9 |
| | 13A | Same as present invention target 13A | 225 | 1.6 | 1.7 |
| | 14A | Same as present invention target 14A | 210 | 1.8 | 1.7 |
| | 15A | Same as present invention target 15A | 205 | 1.8 | 1.6 |
| | 16A | Same as present invention target 16A | 190 | 2 | 1.5 |
| | 17A | Same as present invention target 17A | 180 | 2.1 | 1.4 |
| | 18A | Same as present invention target 18A | 170 | 2.3 | 1.2 |
| | 19A | Same as present invention target 19A | 180 | 2.2 | 1.1 |
| | 20A | Same as present invention target 20A | 195 | 2 | 1.3 |
| | 21A | Same as present invention target 21A | 210 | 1.9 | 1.2 |
| | 22A | Same as present invention target 22A | 185 | 2.1 | 1.1 |
| | 23A | Same as present invention target 23A | 215 | 1.8 | 1.2 |
| | 24A | Same as present invention target 24A | 195 | 2 | 1.2 |
| | 25A | Same as present invention target 25A | 210 | 1.8 | 1.3 |
| | 26A | Same as present invention target 26A | 180 | 2.1 | 1.1 |

TABLE 9

| Semi-reflective film | | Composition of semi-reflective film (% by mass) | Thermal conductivity (W/m·k) | Absorptance at wavelength of 650 nm (%) | Increase in absorptance (%) |
|---|---|---|---|---|---|
| Present invention | 27A | Same as present invention target 27A | 175 | 2.3 | 1.2 |
| | 28A | Same as present invention target 28A | 200 | 2 | 1.4 |
| | 29A | Same as present invention target 29A | 210 | 1.9 | 1.2 |
| | 30A | Same as present invention target 30A | 170 | 2.3 | 1.1 |
| | 31A | Same as present invention target 31A | 205 | 1.8 | 1.4 |
| | 32A | Same as present invention target 32A | 180 | 2.1 | 1.3 |
| | 33A | Same as present invention target 33A | 205 | 1.9 | 1.3 |
| | 34A | Same as present invention target 34A | 190 | 2 | 1.2 |
| | 35A | Same as present invention target 35A | 190 | 2 | 1.2 |
| | 36A | Same as present invention target 36A | 190 | 2.1 | 1.2 |
| | 37A | Same as present invention target 37A | 185 | 2.2 | 1.1 |
| | 38A | Same as present invention target 38A | 180 | 2.2 | 1.1 |
| | 39A | Same as present invention target 39A | 170 | 2.4 | 1.0 |
| | 40A | Same as present invention target 40A | 175 | 2.3 | 1.1 |
| | 41A | Same as present invention target 41A | 190 | 2 | 1.4 |
| | 42A | Same as present invention target 42A | 185 | 2.2 | 1.3 |
| | 43A | Same as present invention target 43A | 190 | 1.9 | 1.2 |
| | 44A | Same as present invention target 44A | 185 | 2.1 | 1.2 |
| | 45A | Same as present invention target 45A | 180 | 2.3 | 1.1 |
| | 46A | Same as present invention target 46A | 185 | 2.1 | 1.1 |
| Comparative | 1A | Same as comparative target 1A | 255 | 6.5 | 7.9 |
| | 2A | Same as comparative target 2A | 175 | 5.4 | 2.0 |
| | 3A | Same as comparative target 3A | 170 | 4.8 | 1.9 |
| | 4A | Same as comparative target 4A | 120 | 6.5 | 1.3 |
| | 5A | Same as comparative target 5A | 125 | 7.1 | 1.1 |
| | 6A | Same as comparative target 6A | 115 | 6.3 | 1.2 |

TABLE 10

| Semi-reflective film | | Composition of semi-reflective film (% by mass) | Thermal conductivity (W/m·k) | Absorptance at wavelength of 650 nm (%) | Increase in absorptance (%) |
|---|---|---|---|---|---|
| Comparative | 7A | Same as comparative target 7A | 120 | 6.9 | 1.0 |
| | 8A | Same as comparative target 8A | 100 | 7.2 | 1.0 |
| | 9A | Same as comparative target 9A | 110 | 7.3 | 1.1 |
| | 10A | Same as comparative target 10A | 95 | 7.5 | 0.9 |

TABLE 10-continued

| Semi-reflective film | | Composition of semi-reflective film (% by mass) | Thermal conductivity (W/m · k) | Absorptance at wavelength of 650 nm (%) | Increase in absorptance (%) |
|---|---|---|---|---|---|
| | 11A | Same as comparative target 11A | 115 | 6.8 | 1.1 |
| | 12A | Same as comparative target 12A | 125 | 6.9 | 1.0 |
| Conventional | 1A | Same as conventional target 1A | 312 | 12.5 | 19.6 |
| | 2A | Same as conventional target 2A | 165 | 3.4 | 13.2 |

As seen from the results shown in Tables 1, 2 and 8 to 10, present invention semi-reflective films 1A to 46A obtained by sputtering present invention targets 1A to 46A were superior to the semi-reflective film obtained by sputtering conventional target 1A in that they exhibited smaller absorptance, and the increase in the absorptance by agglomeration was small. Further, the present invention semi-reflective films 1A to 46A were superior to the semi-reflective film obtained by sputtering conventional target 2A in that they exhibited higher thermal conductivity and smaller absorptance. Therefore, it was found that the present invention semi-reflective films 1A to 46A exhibited excellent properties as semi-reflective films. On the other hand, the semi-reflective films obtained by sputtering comparative targets 1A to 12A which contained Mg and Ca but were outside the scope of the present invention were disadvantageous in that the absorptance deteriorated and the thermal conductivity became low.

Next, as raw materials, Ag having a purity of 99.99% by mass or more, Mg having a purity of 99.9% by mass or more and Eu, Pr, Ce, Sm, Nd and Y having a purity of 99% by mass or more were prepared.

Firstly, Ag was melted in a high-frequency vacuum melting furnace to obtain a molten Ag. Then, Mg was added to the molten Ag, followed by addition of Eu, Pr, Ce, Sm, Nd and Y. The resulting molten metal was cast to obtain an ingot. Then, the obtained ingot was subjected to cold rolling, heating in air at 600° C. for 2 hours, and mechanical working, thereby obtaining present invention targets 1B to 30B, comparative targets 1B to 10B and conventional targets 1B and 2B which had a size of 152.4 mm in diameter and 6 mm in thickness, and the respective compositions indicated in Tables 11 and 12.

Using the thus obtained present invention targets 1B to 30B, comparative targets 1B to 10B and conventional targets 1B and 2B, semi-reflective films were produced, and the following measurements were performed with respect to the produced semi-reflective films. The results are shown in Tables 13 and 14.

(g) Measurement of Thermal Conductivity of Semi-reflective Film

Present invention targets 1B to 30B, comparative targets 1B to 10B and conventional targets 1B and 2B were respectively soldered to backing plates made of oxygen-free copper. Each backing plate was mounted on a direct-current magnetron sputtering apparatus. Then, using a vacuum exhauster, the pressure inside the direct-current magnetron sputtering apparatus was reduced to $1 \times 10^{-4}$ Pa. Then, an Ar gas was introduced into the sputtering apparatus and a gas pressure of 1.0 Pa as a sputtering condition was obtained. Thereafter, from a direct current power source, direct-current power of 250 W was applied to the target to generate plasma between the target and a Si wafer substrate provided with an oxide film and having a size of 30 mm in length, 30 mm in width and 1 mm in thickness which was placed opposite to the target in parallel arrangement with an intervening spacing of 70 mm. In this manner, present invention semi-reflective films 1B to 30B, comparative semi-reflective films 1B to 10B and conventional semi-reflective films 1B and 2B having a thickness of 100 nm and the respective compositions shown in Tables 13 and 14 were formed.

With respect to the present invention semi-reflective films 1B to 30B, comparative semi-reflective films 1B to 10B and conventional semi-reflective films 1B and 2B having the respective compositions shown in Tables 13 and 14, the specific resistance was measured by a four-point probe method. From the specific resistance, the thermal conductivity was determined by the formula of Wiedemann-Franz law: $\kappa = 2.44 \times 10^{-8}$ T/ρ (wherein κ represents thermal conductivity, T represents absolute temperature, and ρ represents specific resistance). The results are shown in Tables 13 and 14.

(h) Measurement of Absorptance of Semi-reflective Film

For measuring the reflectivity and the transmittance, plasma was generated between a polycarbonate substrate having a size of 30 mm in length, 30 mm in width and 0.6 mm in thickness and present invention targets 1B to 30B, comparative targets 1B to 10B and conventional targets 1B and 2B, thereby respectively forming present invention semi-reflective films 1B to 30B, comparative semi-reflective films 1B to 10B and conventional semi-reflective films 1B and 2B having a thickness of 10 nm and the respective compositions shown in Tables 13 and 14 on polycarbonate substrates. With respect to the semi-reflective films, the reflectivity and transmittance at a wavelength of 650 nm were measured on the semi-reflective film side using a spectrophotometer. The absorptance was defined by the formula: 100−(reflectivity+transmittance). The results are shown in Tables 13 and 14.

(i) Measurement of Agglomeration Resistance of Semi-reflective Film

Plasma was generated between polycarbonate substrates having a size of 30 mm in length, 30 mm in width and 0.6 mm in thickness and present invention targets 1B to 30B, comparative targets 1B to 10B and conventional targets 1B and 2B, thereby respectively forming present invention semi-reflective films 1B to 30B, comparative semi-reflective films 1B to 10B and conventional semi-reflective films 1B and 2B having the respective compositions shown in Tables 13 and 14 on polycarbonate substrates. The thus obtained semi-reflective films were used as samples for evaluating the agglomeration resistance. The samples were placed within a thermohygrostat at a temperature of 90° C. and a relative humidity of 85% for 300 hours. Then, with respect to the samples, the reflectivity and transmittance at a wavelength of 650 nm were measured on the semi-reflective film side using a spectrophotometer, and the absorptance of the film after the agglomeration resistance test was determined in the same manner as described above. Using the absorptance values measured in item (h) above as the aborptance prior to the agglomeration resistance test, the increase in the absorptance following the agglomeration resistance test was determined to evaluate the agglomeration resistance of the semi-reflective films. The results are shown in Tables 13 and 14.

TABLE 11

| | Target | Mg | Eu, Pr, Ce, Sm | Ag and inevitable impurities |
|---|---|---|---|---|
| Present invention | 1B | 0.05 | Eu: 0.9 | Remainder |
| | 2B | 0.1 | Eu: 0.7 | Remainder |
| | 3B | 0.2 | Eu: 0.4 | Remainder |
| | 4B | 0.3 | Eu: 0.2 | Remainder |
| | 5B | 0.5 | Eu: 0.1 | Remainder |
| | 6B | 0.7 | Pr: 0.3 | Remainder |
| | 7B | 0.9 | Pr: 0.2 | Remainder |
| | 8B | 0.3 | Pr: 0.7 | Remainder |
| | 9B | 0.3 | Pr: 0.3 | Remainder |
| | 10B | 0.2 | Pr: 0.5 | Remainder |
| | 11B | 0.2 | Ce: 0.9 | Remainder |
| | 12B | 0.2 | Ce: 0.7 | Remainder |
| | 13B | 0.3 | Ce: 0.5 | Remainder |
| | 14B | 0.2 | Ce: 0.3 | Remainder |
| | 15B | 0.3 | Ce: 0.1 | Remainder |
| | 16B | 0.2 | Sm: 0.5 | Remainder |
| | 17B | 0.1 | Sm: 0.8 | Remainder |
| | 18B | 0.1 | Sm: 0.2 | Remainder |
| | 19B | 0.2 | Sm: 0.2 | Remainder |
| | 20B | 0.3 | Sm: 0.1 | Remainder |
| | 21B | 0.1 | Eu: 0.2, Pr: 0.2 | Remainder |
| | 22B | 0.2 | Eu: 0.2, Ce: 0.1 | Remainder |
| | 23B | 0.3 | Eu: 0.1, Sm: 0.2 | Remainder |

TABLE 11-continued

| Target | Mg | Eu, Pr, Ce, Sm | Ag and inevitable impurities |
|---|---|---|---|
| 24B | 0.1 | Pr: 0.5, Ce: 0.3 | Remainder |
| 25B | 0.2 | Pr: 0.3, Sm: 0.2 | Remainder |
| 26B | 0.3 | Ce: 0.1, Sm: 0.1 | Remainder |
| 27B | 0.1 | Eu: 0.3, Pr: 0.2, Ce: 0.2 | Remainder |
| 28B | 0.2 | Eu: 0.1, Pr: 0.3, Sm: 0.1 | Remainder |
| 29B | 0.3 | Pr: 0.1, Ce: 0.1, Sm: 0.5 | Remainder |
| 30B | 0.1 | Eu: 0.2, Pr: 0.2, Ce: 0.1, Sm: 0.1 | Remainder |

TABLE 12

| | Target | Mg | Eu, Pr, Ce, Sm, Nd, Y | Ag and inevitable impurities |
|---|---|---|---|---|
| Comparative | 1B | 0.04* | Eu: 0.3 | Remainder |
| | 2B | 1.1* | Pr: 0.3 | Remainder |
| | 3B | 0.3 | Eu: 0.04* | Remainder |
| | 4B | 0.2 | Eu: 1.1* | Remainder |
| | 5B | 0.2 | Pr: 0.04* | Remainder |
| | 6B | 0.3 | Pr: 1.1* | Remainder |
| | 7B | 0.3 | Ce: 0.04* | Remainder |
| | 8B | 0.2 | Ce: 1.1* | Remainder |
| | 9B | 0.2 | Sm: 0.04* | Remainder |
| | 10B | 0.3 | Sm: 1.1* | Remainder |
| Conventional | 1B | 0.3 | Nd: 0.4 | Remainder |
| | 2B | 0.3 | Y: 0.4 | Remainder |

Note:
*indicates a value outside the scope of the present invention

TABLE 13

| | Semi-reflective film | Composition of semi-reflective film (% by mass) | Thermal conductivity (W/m·k) | Absorptance at wavelength of 650 nm (%) | Increase in absorptance (%) |
|---|---|---|---|---|---|
| Present invention | 1B | Same as present invention target 1B | 180 | 2.0 | 1.4 |
| | 2B | Same as present invention target 2B | 185 | 1.9 | 1.1 |
| | 3B | Same as present invention target 3B | 200 | 1.7 | 1.0 |
| | 4B | Same as present invention target 4B | 205 | 1.8 | 1.2 |
| | 5B | Same as present invention target 5B | 190 | 2.0 | 1.4 |
| | 6B | Same as present invention target 6B | 185 | 2.3 | 1.3 |
| | 7B | Same as present invention target 7B | 170 | 2.4 | 1.3 |
| | 8B | Same as present invention target 8B | 190 | 2.2 | 1.2 |
| | 9B | Same as present invention target 9B | 200 | 2.0 | 1.1 |
| | 10B | Same as present invention target 10B | 200 | 2.1 | 1.1 |
| | 11B | Same as present invention target 11B | 170 | 2.0 | 1.4 |
| | 12B | Same as present invention target 12B | 190 | 2.1 | 1.2 |
| | 13B | Same as present invention target 13B | 195 | 1.9 | 1.0 |
| | 14B | Same as present invention target 14B | 200 | 1.7 | 1.0 |
| | 15B | Same as present invention target 15B | 205 | 2.0 | 1.4 |

TABLE 13-continued

| Semi-reflective film | | Composition of semi-reflective film (% by mass) | Thermal conductivity (W/m · k) | Absorptance at wavelength of 650 nm (%) | Increase in absorptance (%) |
|---|---|---|---|---|---|
| | 16B | Same as present invention target 16B | 185 | 1.9 | 1.0 |
| | 17B | Same as present invention target 17B | 180 | 2.2 | 1.2 |
| | 18B | Same as present invention target 18B | 210 | 1.7 | 1.3 |
| | 19B | Same as present invention target 19B | 200 | 1.8 | 1.3 |
| | 20B | Same as present invention target 20B | 205 | 1.9 | 1.4 |
| | 21B | Same as present invention target 21B | 195 | 1.9 | 1.1 |
| | 22B | Same as present invention target 22B | 195 | 1.9 | 1.0 |
| | 23B | Same as present invention target 23B | 190 | 2.0 | 1.1 |
| | 24B | Same as present invention target 24B | 170 | 2.1 | 1.2 |
| | 25B | Same as present invention target 25B | 195 | 1.9 | 1.2 |
| | 26B | Same as present invention target 26B | 200 | 1.8 | 10 |

TABLE 14

| Semi-reflective film | | Composition of semi-reflective film (% by mass) | Thermal conductivity (W/m · k) | Absorptance at wavelength of 650 nm (%) | Increase in absorptance (%) |
|---|---|---|---|---|---|
| Present invention | 27B | Same as present invention target 27B | 175 | 2.0 | 1.3 |
| | 28B | Same as present invention target 28B | 195 | 1.9 | 1.2 |
| | 29B | Same as present invention target 29B | 190 | 2.0 | 1.3 |
| | 30B | Same as present invention target 30B | 190 | 1.9 | 1.2 |
| Comparative | 1B | Same as comparative target 1B | 205 | 1.8 | 7.5 |
| | 2B | Same as comparative target 2B | 165 | 6.4 | 1.3 |
| | 3B | Same as comparative target 3B | 200 | 1.8 | 10.3 |
| | 4B | Same as comparative target 4B | 155 | 2.3 | 5.7 |
| | 5B | Same as comparative target 5B | 210 | 1.7 | 13.1 |
| | 6B | Same as comparative target 6B | 150 | 2.4 | 6.1 |
| | 7B | Same as comparative target 7B | 205 | 1.8 | 11.8 |
| | 8B | Same as comparative target 8B | 155 | 2.4 | 5.9 |
| | 9B | Same as comparative target 9A | 210 | 1.7 | 13.6 |
| | 10B | Same as comparative target 10B | 160 | 2.3 | 6.4 |
| Conventional | 1A | Same as conventional target 1B | 185 | 5.7 | 1.2 |
| | 2A | Same as conventional target 2B | 160 | 6.2 | 1.4 |

As seen from the results shown in Tables 11 to 14, the semi-reflective films obtained by sputtering present invention targets 1B to 30B were superior to the semi-reflective films obtained by sputtering conventional targets 1B and 2B in that they exhibited high thermal conductivity, and small increase in absorptance which means that they exhibit excellent agglomeration resistance, thereby resulting in small change in the absorptance with lapse of time. Therefore, it was found that the present invention semi-reflective films 1B to 30B exhibited excellent properties as semi-reflective films. On the other hand, the semi-reflective films 1B to 10B which contained Mg and Ca but were outside the scope of the present invention were disadvantages in that the increase in absorptance deteriorated (increase in absorptance became large) and the thermal conductivity became low.

INDUSTRIAL APPLICABILITY

The semi-reflective film and reflective film for an optical recording medium according to the present invention are advantageous in that they exhibit excellent properties such as low absorptance, high agglomeration resistance and high corrosion resistance, and the increase in absorptance is suppressed even after repeatedly recording, replaying or erasing over a long period. Therefore, the semi-reflective film and reflective film for an optical recording medium according to the present invention can be advantageously used as a constituent layer of an optical recording medium such as an optical recording disc (CD-RW, DVD-RW, DVD-RAM, etc.) for recording, replaying or erasing, especially an optical recording disc for recording, replaying or erasing utilizing a blue laser beam (e.g., an optical recording disc of Blu-ray Disc standard or HD DVD standard).

The invention claimed is:

1. A semi-reflective film for an optical recording medium, which is made of a silver alloy having a composition consisting of 0.05 to 1% by mass of Mg, 0.2 to 1% by mass of Eu, and a remainder containing Ag and inevitable impurities.

2. An Ag alloy sputtering target for forming a semi-reflective film for an optical recording medium, which is made of a silver alloy having a composition consisting of 0.05 to 1% by mass of Mg, 0.2 to 1% by mass of Eu, and a remainder containing Ag and inevitable impurities.

3. A semi-reflective film for an optical recording medium, which is made of a silver alloy having a composition consisting of 0.05 to 1% by mass of Mg, 0.2 to less than 1% by mass of Eu, 0.2 to less than 1% by mass of one or more of Pr, Ce and Sm, and a remainder containing Ag and inevitable impurities, wherein a combined total of Eu and one or more of Pr, Ce and Sm is 1% or less.

4. An Ag alloy sputtering target for forming a semi-reflective film for an optical recording medium, which is made of a silver alloy having a composition consisting of 0.05 to 1% by mass of Mg, 0.2 to less than 1% by mass of Eu, 0.2 to less than 1% by mass of one or more of Pr, Ce and Sm, and a remainder containing Ag and inevitable impurities, wherein a combined total of Eu and one or more of Pr, Ce and Sm is 1% or less.

5. A semi-reflective film for an optical recording medium according to claim 1, wherein the silver alloy is obtained from an ingot that contains melted component metals, said ingot being subjected to cold working, followed by a heating process.

6. An Ag alloy sputtering target for forming a semi-reflective film according to claim 2, wherein the silver alloy is obtained from an ingot that contains melted component metals, said ingot being subjected to cold working, followed by a heating process.

7. A semi-reflective film for an optical recording medium according to claim 3, wherein the silver alloy is obtained from an ingot that contains melted component metals, said ingot being subjected to cold working, followed by a heating process.

8. An Ag alloy sputtering target for forming a semi-reflective film according to claim 4, wherein the silver alloy is obtained from an ingot that contains melted component metals, said ingot being subjected to cold working, by a heating process.

* * * * *